(12) United States Patent
Furusawa

(10) Patent No.: US 7,208,764 B2
(45) Date of Patent: Apr. 24, 2007

(54) LIQUID CRYSTAL DISPLAY DEVICE HAVING PARTITION WALLS

(75) Inventor: Masahiro Furusawa, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/420,335

(22) Filed: Apr. 22, 2003

(65) Prior Publication Data

US 2004/0005739 A1    Jan. 8, 2004

(30) Foreign Application Priority Data

Apr. 22, 2002  (JP) .............................. 2002-119969

(51) Int. Cl.
| | |
|---|---|
| H01L 29/04 | (2006.01) |
| H01L 31/036 | (2006.01) |
| H01L 31/0376 | (2006.01) |
| H01L 31/112 | (2006.01) |

(52) U.S. Cl. ..................... 257/72; 257/59; 257/66; 257/69

(58) Field of Classification Search ................ 257/72, 257/57, 59, 66, 69; 315/169.1; 349/110, 349/106; 359/67; 430/200
See application file for complete search history.

(56) References Cited

U.S. PATENT DOCUMENTS

| | | | | |
|---|---|---|---|---|
| 5,420,706 | A | * | 5/1995 | Yamazaki et al. .......... 349/110 |
| 5,920,083 | A | * | 7/1999 | Bae .............................. 257/59 |
| 6,194,837 | B1 | * | 2/2001 | Ozawa ..................... 315/169.1 |
| 6,586,153 | B2 | * | 7/2003 | Wolk et al. ................. 430/200 |
| 2002/0054252 | A1 | * | 5/2002 | Ishii et al. .................. 349/106 |

FOREIGN PATENT DOCUMENTS

| | | | | |
|---|---|---|---|---|
| JP | 9-15580 | * | 1/1997 | ................. 349/110 |
| JP | 09-258199 | | 10/1997 | |
| JP | 09-292633 | | 11/1997 | |
| JP | 10-133194 | | 5/1998 | |
| JP | 10-170712 | | 6/1998 | |

(Continued)

OTHER PUBLICATIONS

Partial English translation of Japanese patent No. 2002-55363.*

(Continued)

Primary Examiner—Shouxiang Hu
(74) Attorney, Agent, or Firm—Harness, Dickey & Pierce, P.L.C.

(57) ABSTRACT

A liquid crystal display device 100 comprises a thin film transistor T, a source (data) line 26, a color filter 23, a pixel electrode 24 and the like. After a gate electrode 13, a gate insulating film 16, and a channel region 18 are formed on the glass substrate 10, a polyimide film 20 is formed to surround the peripheries of the region for forming the source/drain regions 22, the color filter 23, the pixel electrode 24, and the source line 26, respectively. A liquid material is applied to the regions surrounded with the wall made of the polyimide film 20 and a thermal treatment is performed to form the element of the color filter 23, the pixel electrode 24 and the like. The polyimide film 20 has a property of light-shielding and then has a function as a black matrix for shielding the surroundings of the pixel region.

12 Claims, 13 Drawing Sheets

FOREIGN PATENT DOCUMENTS

| | | | | |
|---|---|---|---|---|
| JP | 10-186412 | | 7/1998 | |
| JP | 10-206888 | * | 8/1998 | ................ 257/59 |
| JP | 10-319430 | | 12/1998 | |
| JP | 11-190859 | | 7/1999 | |
| JP | 2000-098368 | | 4/2000 | |
| JP | 2000-284326 | * | 10/2000 | ................ 257/57 |
| JP | 2001-042313 | | 2/2001 | |
| JP | 2001-142064 | | 5/2001 | |
| JP | 2001-194659 | | 7/2001 | |
| JP | 2001-242468 | | 9/2001 | |
| JP | 2001-242475 | | 9/2001 | |
| JP | 2001-242476 | | 9/2001 | |
| JP | 2002-55363 | * | 2/2002 | ................ 257/69 |
| JP | 2002-062422 | | 2/2002 | |

OTHER PUBLICATIONS

Partial English translation of Japanese patent No. 10-206888.*

* cited by examiner (a)

(b)

SECTION A-A'

(a)

(b)

SECTION B-B'

(a)

(b)

SECTION C-C'

(a)

(b)

SECTION D-D'

(a)

(b)

SECTION E-E'

(a)

(b)

SECTION F-F'

(a)

(b)

SECTION G-G'

(a)

(b)

SECTION H-H'

(a)

(b)

SECTION I-I'

(a)

(b)

SECTION J-J'

LIQUID CRYSTAL DISPLAY DEVICE HAVING PARTITION WALLS

BACKGROUND OF THE INVENTION

1. Technical Field of the Invention

The present invention relates to a method of manufacturing a device (for example, a liquid crystal display device) comprising thin film elements such as thin film transistors, and to a device manufactured by means of the method.

2. Description of the Related Art

Liquid crystal display devices, which are electro-optical devices, have features of being thin and lightweight and have low power consumption, and thus they are used for various electronic apparatuses, such as personal computers, mobile phones, digital still cameras, and liquid crystal televisions.

The liquid crystal display device is provided with pixel portions using active elements such as thin film transistors. As the thin film transistor constituting the pixel portion, the inversely staggered type (or bottom gate type) structure constructed by forming a gate electrode on a substrate and laminating a semiconductor layer such as a channel region, a source/drain region, or an insulating layer thereon is being widely employed.

A pixel circuit of the liquid crystal display device is constructed by combining elements such as a scanning line for supplying a signal to these thin film transistors and the gate electrode, a data line for supplying a data signal to the source/drain region, or a pixel electrode connected to the source/drain region for applying voltage to a liquid crystal layer. A substrate (an array substrate) has the pixel circuit formed thereon and a counter substrate has a counter electrode formed thereon, a color filter and a light shielding film (a so called black matrix) shielding the surroundings of the color filter, etc. are bonded together and a liquid crystal material is inserted and sealed therebetween, thereby constructing a liquid crystal panel. Then, the liquid crystal panel is provided with peripheral members such as a driving circuit or a backlight to construct a liquid crystal display device.

The aforementioned liquid crystal display device is generally manufactured by repeating many times a process for forming a thin film by means of the vapor phase deposition method (that is, the vacuum process) such as the CVD method or the sputtering method and removing (etching) the unnecessary portion of the formed thin film by means of the photolithography method.

However, in this conventional manufacturing method, there are disadvantages in that (1) since the process comprising the film formation and the etching is repeated many times, the manufacturing time is long, (2) since much of the formed thin film is removed, the utilization efficiency of raw material is not good, and (3) since waste such as the etching solution is excessively generated, the processing cost thereof is increased. These disadvantages make it difficult to reduce the manufacturing cost in the conventional manufacturing method. These disadvantages become more remarkable as the glass substrate to be a basic material becomes larger with increase in screen size of the liquid crystal display device.

The present invention has been achieved in consideration of the above disadvantages. It is therefore an object of the present invention to provide a method of manufacturing a device which makes it possible to reduce the manufacturing cost.

It is another object of the present invention to provide a device which makes it possible to realize lower cost.

SUMMARY

In order to accomplish the above objects, the present invention provides a method of manufacturing a device, at least some elements of the device are formed by forming films using liquid materials, the method comprising: a process of allocating regions on a substrate for a plurality of elements constituting the device; a partition wall formation process for forming partition walls surrounding the peripheries of at least the regions for the elements using liquid materials, among the regions for the plurality of elements and covering the other regions; and a film formation process of applying the liquid materials to the regions surrounded by the partition walls and performing a thermal treatment, thereby forming films. Furthermore, the partition walls are formed to have a light-shielding property.

Since the elements constituting the device are formed by forming partition walls surrounding the peripheries of some regions for elements of the device and then applying the liquid materials to the regions surrounded with the partition walls to form thin films, the number of execution steps of the conventional process for forming the film by a combination of the vapor phase deposition method such as the CVD method or the sputtering method and the photolithography method can be reduced to simplify the manufacturing process and it is possible to reduce the manufacturing time. Further, since the partition wall is provided, it is possible to minimize the range to which the liquid material is applied and as a result, the utilization efficiency of raw material is good. Furthermore, since the number of etching processes is reduced, it is possible to reduce the amount of waste and thus to reduce the processing cost. Therefore, it is possible to reduce the manufacturing cost of device. These advantages of the present invention become more remarkable with an increase in scale of the device to be manufactured.

Furthermore, since the partition wall has a light-shielding property, incident light to the portions surrounded with the partition wall can be shielded. For example, in the case that thin film devices such as thin film transistors, etc. are formed below the partition wall, it is possible that the partition wall has an additional function as a light shielding film in order to avoid any erroneous operation or any changes of output characteristics due to light irradiation to the thin film devices. Therefore, since a separate process for forming a light shielding film is not necessary, it is possible to simplify the manufacturing process and thus to reduce the processing cost.

It is preferable that the device comprises pixel regions comprising color filters and pixel electrodes. Also, in the aforementioned partition wall formation process, the partition walls may be formed so as to surround the peripheries of first regions for forming the pixel regions and to cover the other regions. The aforementioned film formation process may comprise the pixel region formation process for forming the color filters and the pixel electrodes in the first regions using liquid materials.

A liquid material can be used to form a pixel electrode at low cost. The partition wall used in the formation of the pixel electrode is also used to form a color filter and the pixel electrode and the color filter are formed on the same region, so that it is possible to simplify the manufacturing process for the color filter. Furthermore, in the case that the device is a non-emitting display device such as a liquid crystal display device performing display with control of a light transparent state such as a backlight, since the partition wall having a light-shielding property covers the other regions rather than the pixel region, it is possible that the partition wall can have a function as a black matrix preventing light leakage from the other regions rather than the pixel region or preventing incident light from the thin film transistors driving the pixel region. Therefore, since the process for forming a black matrix is not separately necessary, it is possible to simplify the manufacturing process. Further, since the color filter, the pixel electrode, and the black matrix are formed on the same substrate, in the other substrate (counter substrate) a counter electrode may be formed on one surface of the substrate. In particular, since the patterning is not required, it is possible to greatly simplify the manufacturing process for the counter substrate.

It is preferable that the device is a liquid crystal display device in which the substrate having the pixel electrodes formed thereon and a counter substrate having a counter electrodes formed thereon are disposed with a predetermined gap therebetween and a liquid crystal layer is interposed between the substrates. Furthermore, before the partition wall formation process, a capacitor line formation process for forming capacitor lines on the substrate to construct storage capacitors, by the pixel electrodes and the counter electrodes, for holding a voltage applied to the liquid crystal layer substantially constant during a predetermined time interval is further comprised. In addition, in the capacitor line formation process, the capacitor line is formed along a boundary between the pixel region and the partition wall thereof to cover the boundary and the vicinity thereof.

In the case that the partition wall is formed and the pixel electrode or the color filter is formed using a liquid material, a film thickness of the pixel electrode or the color filter may be not uniform at the vicinity of a wall formed with the partition wall, that is, the vicinity of the periphery of the pixel region and a transmittance at the portions may be also not uniform. Also, since the capacitor line is formed along a boundary between the pixel region and the partition wall thereof to cover the boundary and the vicinity thereof, it is possible to shield any light from passing though regions of which transmittance is not uniform at the vicinity of the periphery of the pixel region by means of the capacitor line, it is possible to solve such problems as display irregularity etc., and it is possible to enhance the display quality. Furthermore, since the capacitor line is formed along the periphery of the pixel region, the ratio of the area of the capacitor line is lowered in the pixel region. Therefore it is possible to increase the opening ratio.

It is preferable that the device further comprises a thin film transistor for driving the pixel electrode, the thin film transistor is formed by sequentially laminating, in order, a gate electrode, a gate insulating film, a channel region, and source/drain regions on the substrate. Also in the aforementioned partition wall formation process, after the gate electrode, the gate insulating film and the channel region are formed on the substrate, the partition wall is formed to surround each of the peripheries of a first region and a second region for forming the source/drain regions and to cover the other regions. In addition, the film formation process further comprises a semiconductor film formation process for forming a semiconductor film, to be the source/drain regions, in the second region using a liquid material. In such a manner, since a liquid material is used for a semiconductor film, it is possible to further reduce the manufacturing cost of the device.

It is preferable that the semiconductor film is formed using a liquid material containing a silicon compound and a dopant source. For example, these liquid material may include a solution containing a silane of high order such as cyclopentasilane ($Si_5H_{10}$) which is made of a silicon compound having one or more ring-shaped structures with ultraviolet ray irradiated for photo-polymerization. For example, the dopant source may include a material containing a Group V element (for example, phosphorus) or Group III element (for example, boron). Since the liquid material containing such a silicon compound and a dopant source is used, it is possible to form a heavily doped silicon film easily.

It is preferable that the device further comprises wiring for supplying current to the thin film transistor. Also, in the aforementioned partition wall formation process, the partition walls may be formed to surround each of the peripheries of the first and second regions and a third region for forming the wiring and to cover the other regions. In addition, the film formation process may comprise a wiring formation process for forming a conductive film, to be the wiring, in the third region using a liquid material. In such a manner, since the conductive film to be wiring is formed using a liquid material, it is possible to further reduce the manufacturing cost for device.

It is preferable that a conductive film is formed using the liquid material containing conductive fine particles. Here, the conductive fine particles may be metal fine particles containing any element selected among gold, silver, copper, palladium, and nickel, or a superconductive fine particles, a conductive polymer, or the fine particles of a superconductor. The metal fine particles are more preferable. A liquid material containing such conductive fine particles can be used to form a conductive film having high quality.

It is preferable that the method comprises an antireflection film formation process for forming an antireflection film covering the upper surfaces of the source/drain regions and the wiring to suppress reflection of incident light. By doing so, it is possible to avoid deterioration of display quality such as contrast deterioration due to the reflection of the light incident to the substrate at the source/drain regions or the wiring.

It is preferable that in the pixel region formation process, the first region has a first liquid material applied thereto and is subjected to a thermal treatment to form the color filter, and then the first region has a second liquid material applied thereto and is subjected to a thermal treatment to form the pixel electrode.

It is preferable that in the pixel region formation process, the first region has a first liquid material applied thereto and is subjected to a thermal treatment to form the pixel electrode, and then the first region has a second liquid material applied thereto and is subjected to a thermal treatment to form the color filter.

It is preferable that in the pixel region formation process, the first region has a liquid material applied thereto and is subjected to a thermal treatment, thereby forming a functional film having the respective functions of the color filter and the pixel electrode.

It is preferable that the aforementioned partition wall is a black-colored polyimide film formed by applying a thermosetting polyimide precursor mixed with a black coloring material therein to the substrate and performing a thermal treatment. In addition, it is preferable that the partition wall is a black-colored polyimide film formed by applying a photo-curing polyimide precursor mixed with a black coloring material therein to the substrate and performing light irradiation. In such a manner, it is possible that the partition wall having a light-shielding property can be easily formed.

In the partition wall formation process, it is preferable that an insulating film is formed on the substrate and openings are formed in the insulating film to expose regions for elements using the liquid material, thereby forming a partition wall. In such a manner, it is possible that the partition wall surrounding the peripheries of the regions of the plurality of elements using the liquid material can be easily formed.

It is preferable that the aforementioned liquid material is provided by means of a droplet ejection method. Therefore, it is possible to supply the liquid material rapidly under the control of drop position and drop quantity.

Further, a device of the present invention is manufactured according any one of the aforementioned methods. By doing so, it is possible to reduce the manufacturing cost for the device. More particularly, a device of the present invention has the constitution described below. In other words, the device of the present invention comprises a plurality of elements formed on a substrate, in which partition walls are provided to surround the peripheries of at least some regions of the plurality of elements and to cover the other regions, and the partition wall are formed with a member having a light-shielding property.

Some of the plurality of elements surrounded with the partition wall are preferably formed using a liquid material.

In addition, it is preferable that some elements may comprise a pixel region comprising a color filter and a pixel electrode, and a partition wall may be formed so as to surround the periphery of at least the pixel region.

It is preferable that the aforementioned device is a liquid crystal display device in which the substrate having the pixel electrodes formed thereon and a counter substrate having a counter electrodes formed thereon are disposed with a predetermined gap therebetween and a liquid crystal layer is interposed between the substrates. In addition, it is preferable that the liquid crystal display device comprises a capacitor line constructing a storage capacitor, by the pixel electrodes and the counter electrodes, for holding a voltage applied to the liquid crystal layer substantially constant during a predetermined time interval and the capacitor line is formed along a boundary between the pixel region and the partition wall thereof to cover the boundary and the vicinity thereof.

It is preferable that the aforementioned pixel region is formed to overlap the pixel electrode on the color filter. It is preferable that the pixel region is formed to overlap the color filter on the pixel electrode. In addition, it is preferable that the pixel region is provided with a functional film having the respective functions of the color filter and the pixel electrode.

Further, it is preferable that the device further comprises a thin film transistor for driving the pixel electrode or the functional film which is formed by sequentially laminating, in order, a gate electrode, a gate insulating film, a channel region, and source/drain regions on the substrate, and the partition wall is formed to surround the respective periphery of the pixel region or peripheries of the source/drain regions of the thin film transistor.

Also, it is preferable that the aforementioned device further comprises wiring for supplying current to the thin film transistor, and partition wall is formed to surround the respective peripheries of the pixel region, the source/drain regions, and the wiring.

It is preferable that the aforementioned partition wall is a polyimide film formed by mixing a black coloring material therein.

Furthermore, the present invention may be an electronic apparatus comprising the aforementioned device. For example, the electronic apparatus includes a personal computer, a liquid crystal television and the like.

DETAILED DESCRIPTION

Now, a liquid crystal display device according to a first embodiment of the present invention and a method of manufacturing thereof will be described with reference to the accompanying drawings.

In the present invention, the droplet ejection method is a method of forming the desired pattern, including the ejected material, by ejecting droplets to a desired region and may be referred to as the inkjet method. In this case, the droplet to be ejected is not so-called ink used for printing, but a liquid material containing materials constituting the device, such materials include materials serving as, for example, the conductive material or insulating material constituting the device. Further, the droplet ejection is not limited to ejection by atomization, but includes continuous ejection of the liquid material drop by drop.

Figure 1:
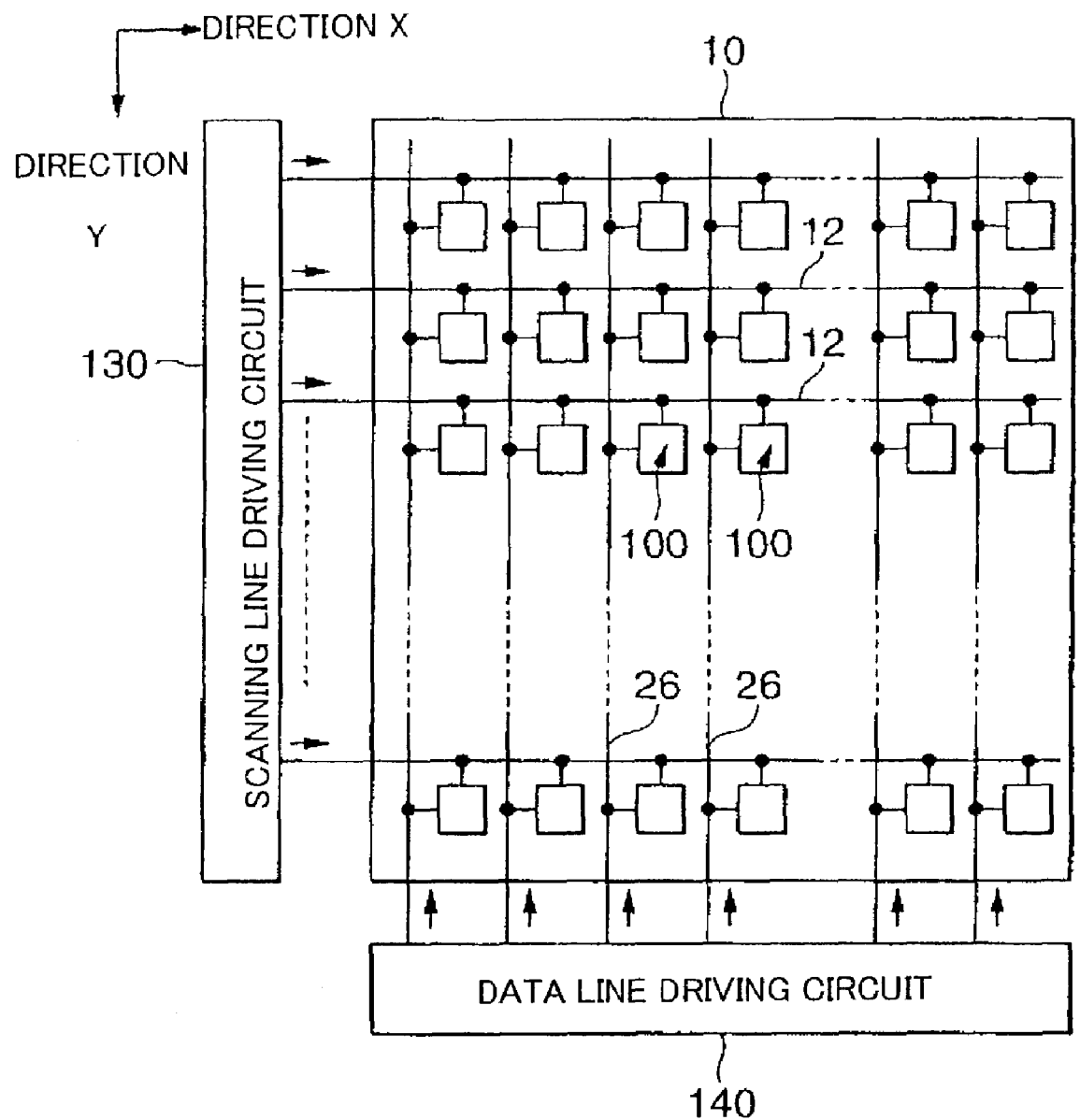
FIG. 1 is a view schematically illustrating configuration of a liquid crystal display device of an embodiment of the present invention.

FIG. 1 schematically illustrates a configuration of a liquid crystal display device of this embodiment. The liquid crystal display device of this embodiment is configured in which an element substrate (array substrate) and a counter substrate are bonded with a constant gap between each other and the liquid material is sandwiched therebetween. As the element substrate and the counter substrate, substrates made of a plate-shaped insulating member comprising glass, quartz or plastics can be used and in this embodiment, a glass substrate is used.

As shown in FIG. 1, a plurality of scanning lines 12 are formed on a glass substrate 10 to extend in the direction of X (row) and these scanning lines 12 are connected to a scanning line driving circuit 130. Further, a plurality of data lines 26 are formed on the glass substrate 10 to extend in the direction of Y (column) and these data lines 26 are connected to a data line driving circuit 140. Also, pixel portions 100 are formed to correspond to each of the intersections of the scanning lines 12 and the data lines 26 and are arranged in a matrix shape. Furthermore, the scanning line driving circuit 130 or the data line driving circuit 140 may be formed on the glass substrate 10.

Figure 2:
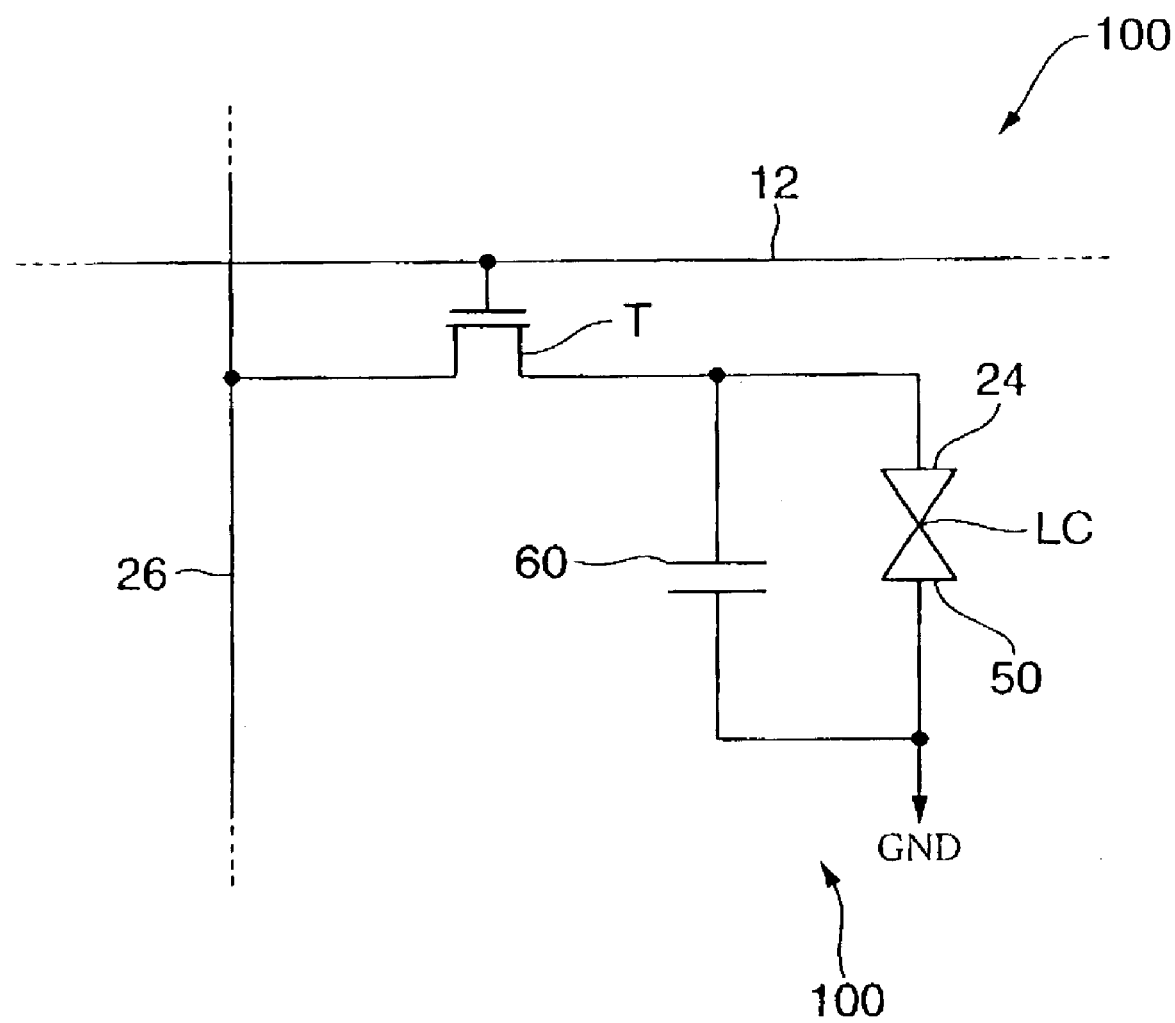
FIG. 2 is a view illustrating a specific example of configuration of a pixel portion.

FIG. 2 illustrates a specific configuration of the pixel portions 100. The pixel portion 100 shown in FIG. 2 is configured such that a gate of a thin film transistor T is connected to the scanning line 12, a source thereof is connected to the data line 26, a drain thereof is connected to a pixel electrode 24 and a liquid crystal LC which is an electro-optical material is sandwiched between the pixel electrode 24 and a counter electrode 50. Furthermore, a storage capacitor 60 is formed between the pixel electrode 24 and a ground potential GND.

This storage capacitor 60 is provided for almost constantly maintaining the applied voltage for a necessary time after voltage is applied to the pixel electrode 24 through the thin film transistor T. The counter electrode 50 is a transparent electrode common to the respective pixels, which is formed on one surface of the counter substrate to be opposite to the pixel electrode 24.

Figure 3:
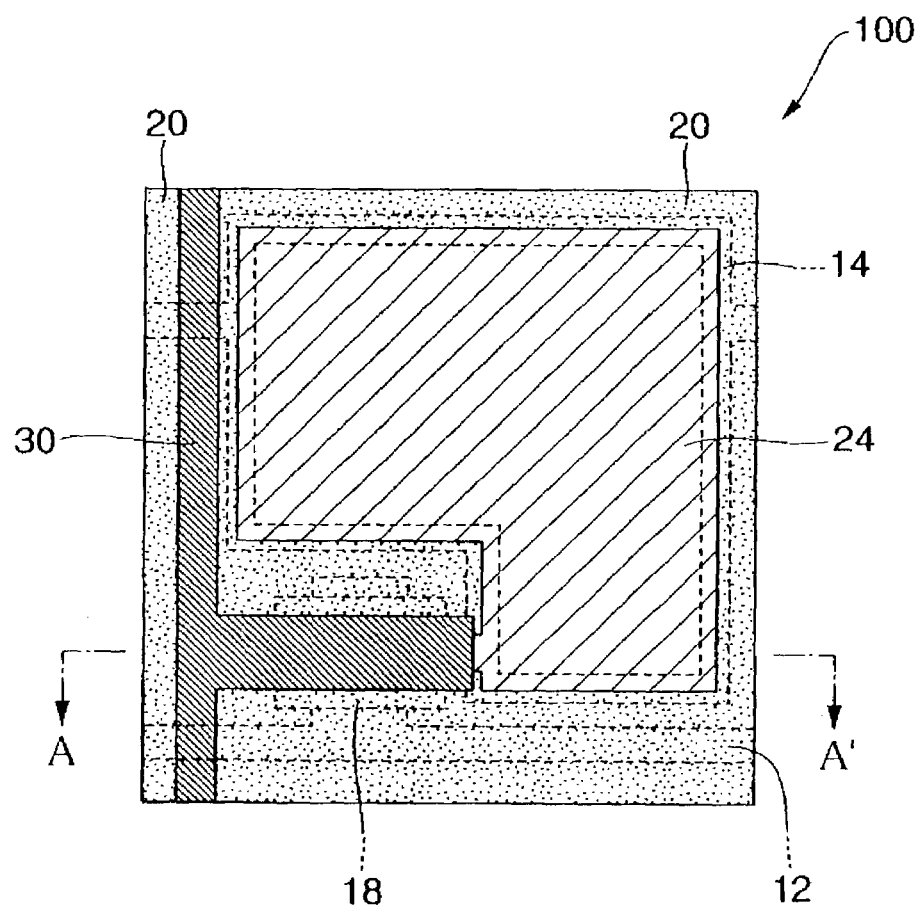
FIGS. 3a and 3b are views illustrating a specific structure of a pixel portion.
Figure 3:
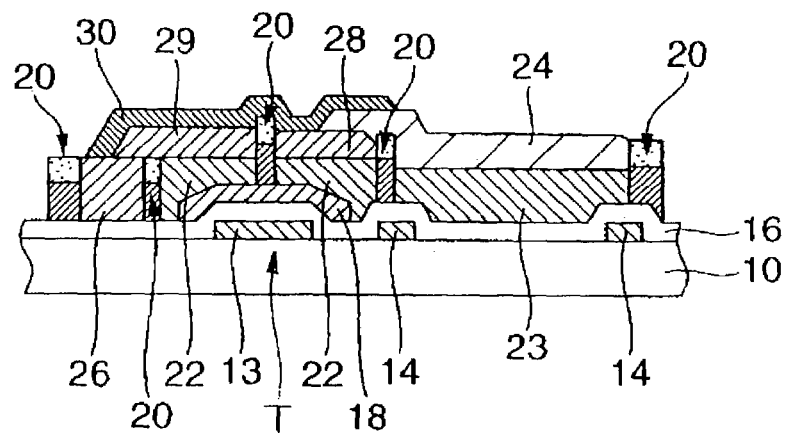

Next, a specific structure of the pixel portion 100 shown in FIG. 2 will be described. FIG. 3 illustrates a specific structure of the pixel portion in the liquid crystal display device of this embodiment. FIG. 3(a) is a plan view considering one pixel portion 100 and FIG. 3(b) is a cross-sectional view taken along a line A–A' shown in FIG. 3(a).

As shown in FIG. 3(b), the thin film transistor T of this embodiment has a so-called inversely staggered structure and comprises a gate electrode 13 formed on the glass substrate 10, a gate insulating film 16 formed on the gate electrode 13, a channel region 18 formed on the gate insulating film and source/drain regions 22 formed on the channel region 18.

Further, the pixel portion 100 of the liquid crystal display device comprises the aforementioned thin film transistor T, a scanning line (gate line) 12, a capacitor line 14, a color filter 23, a pixel electrode 24, a data line (source line) 26 and antireflection film 30, respectively. In this embodiment, the color filter 23 and the pixel electrode 24 are formed to overlap each other in the same region on the glass substrate 10 and a pixel region is defined by them. Furthermore, the gate electrode 13 of the thin film transistor T is formed integrally with the gate line 12.

One source/drain region 22 is electrically connected to the pixel electrode 24 through a connecting portion 28. The pixel electrode 24 is one for applying voltage to the liquid crystal LC. Further, the other source/drain region 22 is electrically connected to the data line 26 through a connecting portion 29.

The capacitor line 14 is formed for the aforementioned storage capacitor 60 (a capacitor to more stably maintain the charges in the liquid crystal layer) and is formed below the pixel electrode 24. In the embodiment, the capacitor line 14 is shaped to surround the periphery of the pixel region where the color filter 23, etc, is formed and has an additional function as a light shielding film (black matrix) for avoiding light leakage from the surroundings of the pixel region. The shape and formation method of the capacitor line 14 will be described later.

Furthermore, a wall (bank) made of a polyimide film 20 is formed to surround the respective peripheries of the source/drain regions 22, the color filter 23, the pixel electrode 24, and the data line 26. This polyimide film 20 is used in forming the source/drain regions 22, the color filter 23, the pixel electrode 24 and the data line 26, respectively and details thereof will be described later.

The antireflection film 30 is formed on the upper surfaces of connecting portions 28, 29 which are formed on the data line 26 and the source/drain regions 22 of the thin film transistor T to avoid the light reflection from data line 26, etc. In other words, since the data line 26 or the connecting portions 28, 29 is formed with a metal film, the reflection of the light incident on the surface of these metal film may deteriorate the display quality of the liquid crystal display device. However, in the embodiment, since the antireflection film 30 is formed on the upper surfaces of the data line 26, the reflection of the light can be avoided. Furthermore, the antireflection film 30 has an additional function as a protective film for protecting the data line 26 or the connecting portion 28, 29.

The array substrate is constructed by forming these pixel portions 100 on the glass substrate 10 in a matrix shape. Also, by performing surface processing such as formation of oriented film to the array substrate, and the counter substrate of which one surface is provided with the counter electrode 50, bonding both, injecting the liquid crystal material between the array substrate and the counter substrate and providing the driving circuit, or the backlight etc., the liquid crystal display device is formed. A specific example of the liquid crystal display device will be described later.

Now, a method of manufacturing the thin film transistor of this embodiment and the pixel circuit comprising the thin film transistor will be described in detail. FIGS. 4 to 9 are explanatory views illustrating the manufacturing method of this embodiment.

Process for Forming the Gate Line, Gate Electrode and Capacitor Line

Figure 4:
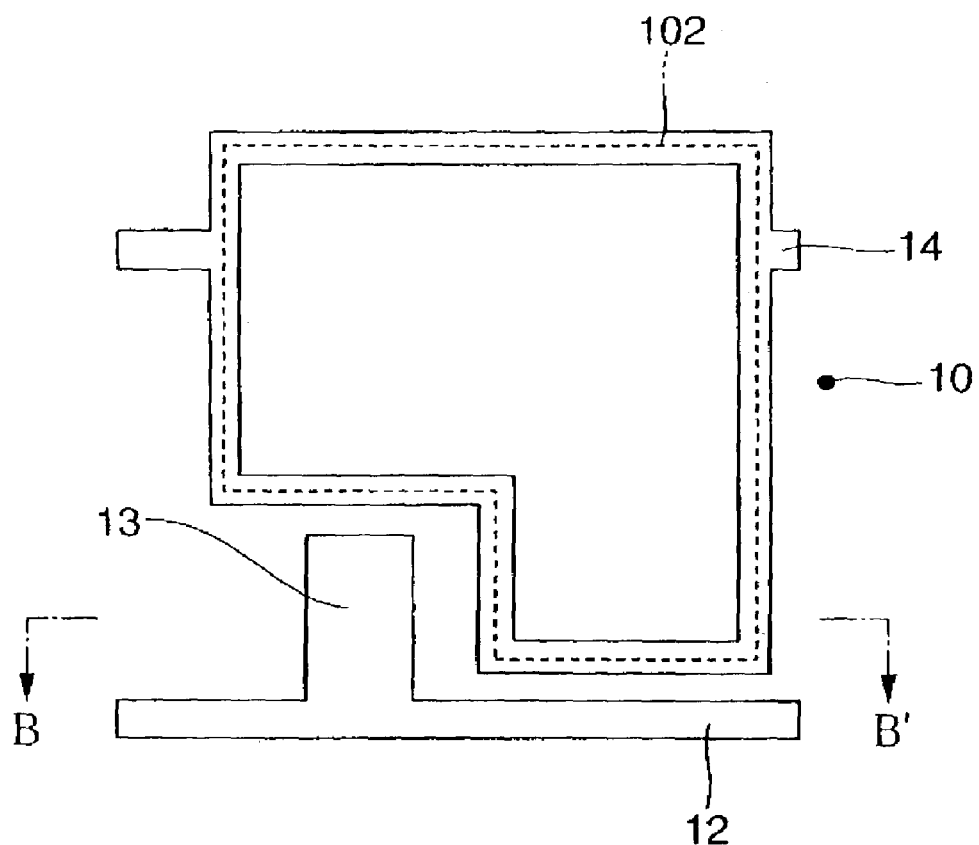
FIGS. 4a and 4b are explanatory views illustrating a manufacturing method according to an embodiment of the present invention.
Figure 4:
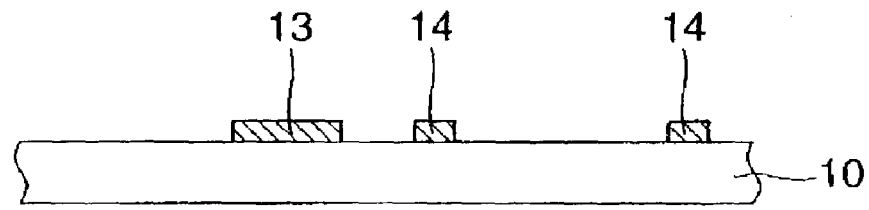

FIG. 4 illustrates the processes of forming the gate line, the gate electrode and the capacitor line. FIG. 4(a) is a plan view of the glass substrate 10 seen from the upper side and FIG. 4(b) is a cross-sectional view taken along a line B–B' shown in FIG. 4(a).

As shown in FIG. 4(a), the gate line 12 and the gate electrode 13 are formed integrally and the capacitor line 14 is formed in predetermined positions on the glass substrate 10, by using the droplet ejection method. The gate line 12 can be provided by forming a conductive film on the whole upper surface of the glass substrate 10 by means of a typical vapor phase deposition method such as a sputtering method, a plasma chemical vapor phase deposition method (PECVD), a low pressure chemical vapor phase deposition method (LPCVD) and the like and then performing patterning thereon though the photolithography method.

In addition, as shown in FIG. 4(a), the capacitor line 14 is formed to surround the periphery of the pixel region 102 (the regions on which the color filter 23 and the pixel electrode 24 should be formed). By doing so, since the capacitor line 14 has an additional function as a black matrix (shielding film) for preventing light leakage from the surroundings of the pixel region 102, it is possible that the pixel region 102 can have a more large area and thus enhances the opening ratio.

Further, the gate line 12, the gate electrode 13 and the capacitor line 14 can be formed using a liquid material. In this case, first, the upper surface of the glass substrate 10 is made to be lyophobic to some extent. Next, a solution containing conductive fine particles is ejected to the upper surface of the glass substrate 10 through the liquid ejection method such as the droplet ejection method to delineate each of the gate line 12, the gate electrode 13 and the capacitor line 14. Thereafter, the glass substrate 10 applied with the solution is subjected to the thermal treatment and as a result, the gate line 12, the gate electrode 13 and the capacitor line 14 are formed.

Here, as with the conductive fine particles, metal fine particles containing any element selected among gold, silver, copper, palladium and nickel or fine particles of conductive polymer or super-semiconductor can be considered. In this embodiment, the solution formed by dispersing these conductive fine particles in an organic solvent is employed. In order to disperse the fine particles, the surfaces of the fine particles can be coated with organic materials. Furthermore, in adhering the materials to the substrate, it is preferable that diameters of the fine particles are 0.1 μm or less for facilitating the dispersion into the solvent and applying the droplet ejection method. For example, by using a solution formed by diluting a paste (using α-terpineol as the dispersing solvent) containing silver fine particles having a diameter of about 0.01 μm with toluene to make its viscosity be about 8 cP, it is possible to form the gate line 12, the gate electrode 13 and the capacitor line 14 having a width of 20 μm, a thickness of 0.5 μm and a resistivity of 2 μΩcm.

However, since the capacitor line 14 has the additional function as the black matrix, it is desirable to form its shape with relatively excellent accuracy. For this reason, in the case that the capacitor line 14 is formed by using a liquid material, the ejection of solution may be carried out after forming the wall (bank) surrounding the forming regions of the capacitor line 14 etc., or the ejection of solution may be carried out after performing a lyophilic processing to the forming regions of the capacitor line 14 in addition to performing a lyophobic processing to the upper surface of the glass substrate 10. By doing so, diffusion of the solution applied to the forming region of the capacitor line 14 can be suppressed, so that the shape of the capacitor line 14 etc. can be formed more accurately. Furthermore, the same method can be applied to form the gate line 12 and the gate electrode 13 and their shape can be formed more accurately.

Process for Forming Gate Insulating Film and Amorphous Silicon Film

Figure 5:
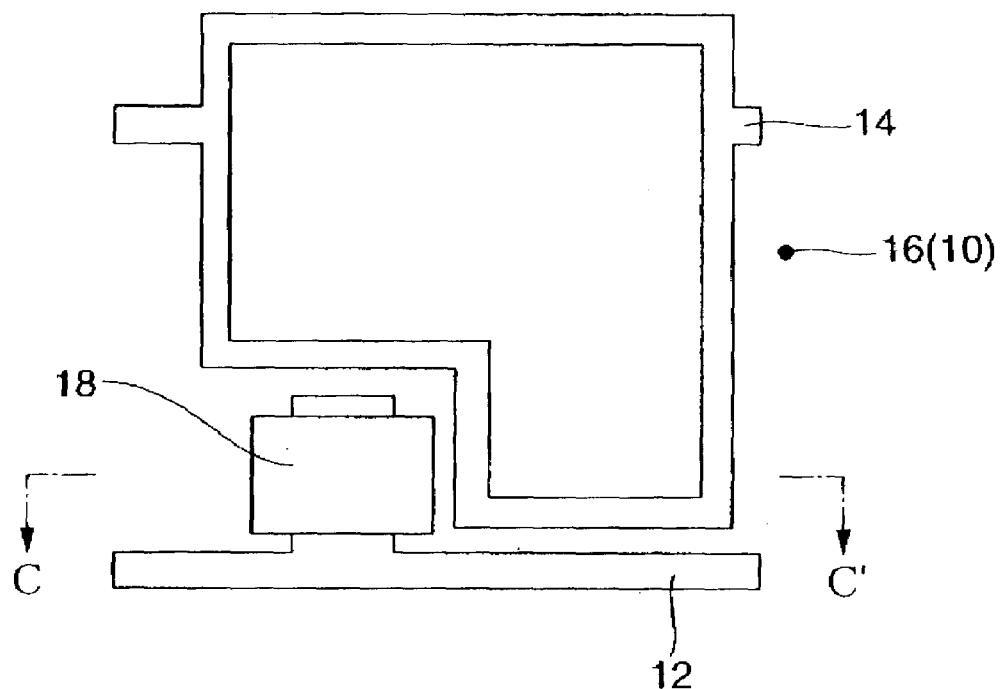
FIGS. 5a and 5b are explanatory views illustrating a manufacturing method according to an embodiment of the present invention.
Figure 5:
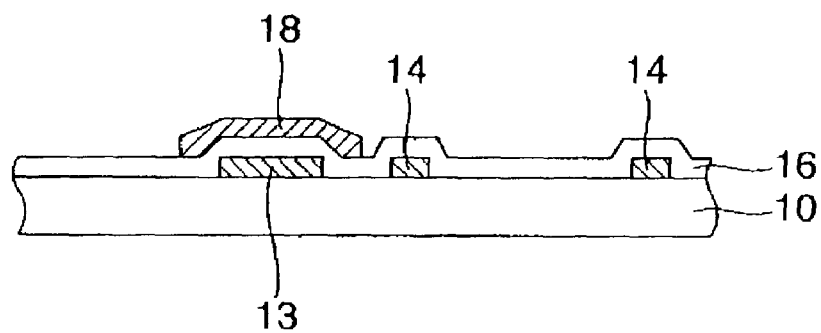

FIG. 5 illustrates the processes of forming the gate insulating film and the amorphous silicon film. FIG. 5(a) is a plan view of the glass substrate 10 seen from the upper side and FIG. 5(b) is a cross-sectional view taken along a line C–C' shown in FIG. 5(a).

As shown in FIG. 5, the gate insulating film 16 is formed on the whole upper surface of the glass substrate 10 to cover the glass substrate 10, the gate line 12, the gate electrode 13 and the capacitor line 14, respectively. It is preferable that the silicon nitride (SiNx) film is formed as the gate insulating film 16 by using the PECVD method. Further, the gate insulating film 16 may be formed as a two-layer structured film deposited to overlap the silicon nitride and the silicon oxide (SiO$_2$). In this case, it is preferable that the film formation is carried out using a so-called continuous CVD method of forming continuously plural types of thin films while changing the reaction gas during the film formation in the CVD method.

Next, the channel region 18 made of the amorphous silicon film is formed at a predetermined position on the gate insulating film 16. Specifically, the channel region 18 is formed in an island shape on the gate electrode 13 as shown in FIG. 5(a), by forming the amorphous silicon film on the whole upper surface of the glass substrate 10 by means of a vapor phase deposition method such as the PECVD method and then patterning the film into a desired shape. Furthermore, it is preferable that the formation of the amorphous silicon film on the glass substrate 10 is carried out successively after the formation of the aforementioned gate insulating film 16 by using the continuous CVD method.

Process for Forming a Bank Made of Polyimide Film)

Figure 6:
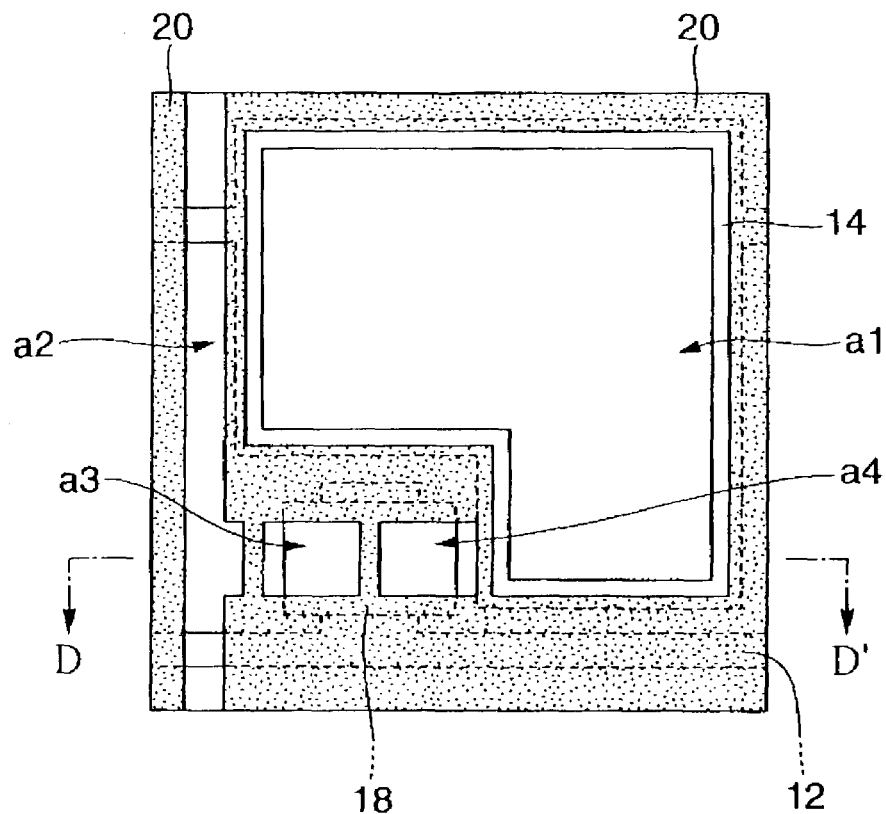
FIGS. 6a and 6b are explanatory views illustrating a manufacturing method according to an embodiment of the present invention.
Figure 6:
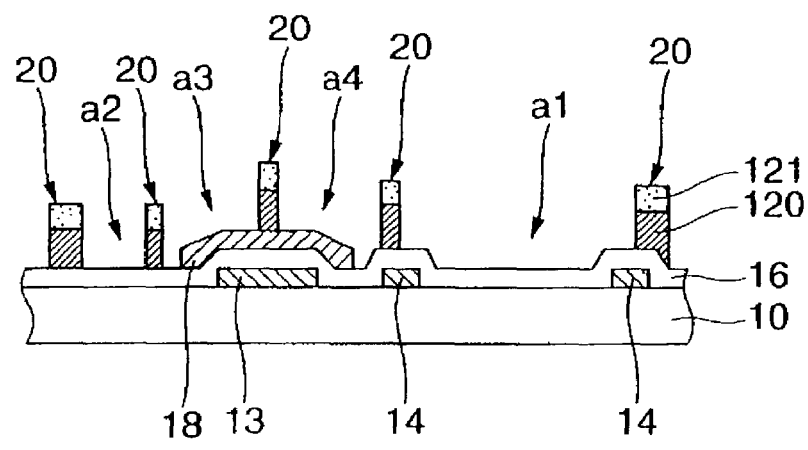

FIG. 6 illustrates the process for forming the bank (wall) made of polyimide film. FIG. 6(a) is a plan view of the glass substrate 10 seen from the upper side and FIG. 6(b) is a cross-sectional view taken along a line D–D' shown in FIG. 6(a).

As shown in FIG. 6, a polyimide film 20 having predetermined shapes of openings a1, a2, a3, a4 is formed on the upper surface of the glass substrate 10. Specifically, the opening a1 provided in the polyimide film 20 is formed to expose the region (the aforementioned pixel region 102) in which the color filter 23 and the pixel electrode 24 should be formed in the subsequent process. Accordingly, the bank made of the polyimide film 20 is formed on the periphery of the forming region of the color filter 23 and the pixel electrode 24.

The opening a2 is formed to expose the region in which the data line 26 should be formed in the subsequent process. Accordingly, the bank made of the polyimide film 20 is formed on the periphery of the forming region of the data line 26. Similarly, the openings a3, a4 are formed to expose the regions in which the source/drain 22 of the thin film transistor T should be formed in the subsequent process. Accordingly, the banks made of the polyimide film 20 are formed on the peripheries of the forming regions of the source/drain regions 22.

This polyimide film 20 is formed to have a two-layered structure of a colored layer 120 having a light-shielding property by means of a coloring process and a non-colored layer 121 which is not subjected to a coloring process. For example, the polyimide film 20 having such a two-layered structure can be formed with the following method.

The colored layer 120 is formed on the whole upper surface of the glass substrate 10 using solvent that makes a polyimide precursor mixed with a coloring material (for example, a black dye, a pigment, and the other fine particles). The polyimide precursor may be a normal thermosetting material or an ultraviolet curing material. The polyimide precursor is applied on the whole upper surface of the glass substrate 10, and then subjected to a thermal treatment (for example, about 300° C. to 400° C.) or a thermal treatment after an ultraviolet irradiation, thereby forming the colored layer 120. Furthermore, the colored layer 120 may be made of any insulating material having a light-shielding property rather than the polyimide, for example, a thin film of a metal oxide being formed a sputtering method or a sol gel method.

Next, a normal (that is, non-colored) ultraviolet cured polyimide precursor is applied on the whole upper surface of the colored layer 120. Next, an ultraviolet ray is illuminated to the polyimide precursor through masks having patterns corresponding to the aforementioned openings a1 to a4, and after development process subjected to a thermal treatment (for example, about 300° C. to 400° C.), thereby forming a pattern of the non-colored layer 121. At this time, since the colored layer 120 is provided below the non-colored layer 121, when the ultraviolet ray irradiation is performed, the ultraviolet ray irradiation rarely approaches the channel region of the thin film transistor T. By doing so, it is possible to avoid the deterioration of the semiconductor film of the channel region 18 and to prevent the deterioration of the characteristics of the thin film transistor T.

Next, a dry etching (or wet etching) is performed using the non-colored layer 121 having patterns as an etching mask. By doing so, the exposed portions of the colored layer 120 corresponding to the openings a1 to a4 are removed. Also, the non-colored layer 121 having a function of a resist, is slightly removed in the case of etching. However, since the non-colored layer 121 is generally formed thicker than the colored layer 120, as shown in the drawing, the pattern of the partition wall can be formed in two-layered structure. In such a manner, the openings a1 to a4 is provided and the two-layered polyimide film 20 comprising the colored layer 120 and the non-colored layer 121 is formed. Furthermore, it is preferable that the polyimide film 20 is formed to be 0.5 to 10 μm thick.

Furthermore, the polyimide film 20 may be formed having only the colored layer 120 in one-layered structure. For example, the colored layer 120 may be formed by applying a solvent made of an ultraviolet cured polyimide precursor mixed with a black dye, a pigment, or the like on the whole upper surface of the glass substrate 10 and performing an ultraviolet irradiation. Next, openings a1 to a4 are provided with pattering and etching processes using photoresists, and then the polyimide film 20 having only the colored layer 120 can be formed in a one-layer structure. In case of a thermosetting polyimide precursor, the polyimide film 20 having only the colored layer 120 can be formed in one-layered structure with the similar method.

Process for Forming Source/Drain Regions

Figure 7:
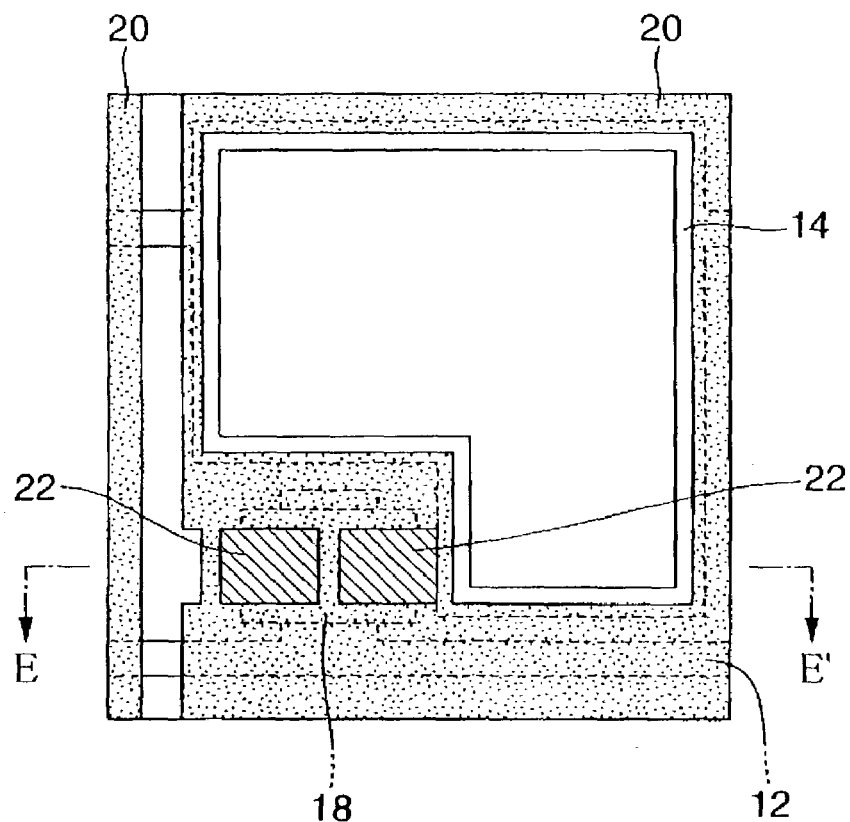
FIGS. 7a and 7b are explanatory views illustrating a manufacturing method according to an embodiment of the present invention.
Figure 7:
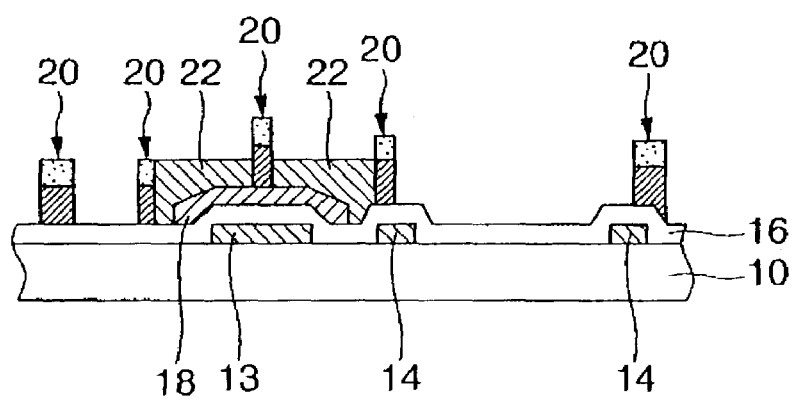

FIG. 7 illustrates the process for forming the source/drain regions. FIG. 7(*a*) is a plan view of the glass substrate 10 seen from the upper side and FIG. 7(*b*) is a cross-sectional view taken along a line E–E' shown in FIG. 7(*a*).

As shown in FIG. 7, the source/drain regions 22 made of the amorphous silicon film into which dopants that have been heavily doped are formed in the openings a3, a4 (see FIG. 6) provided in the polyimide film 20. In this embodiment, the source/drain regions 22 are formed by means of the droplet ejection method.

Specifically, first, a solution containing a silicon compound of which materials containing the Group V element of phosphorus etc. or the Group III element of boron etc. is doped as a dopant source, or a solution containing a silicon compound denatured in elements (phosphorus, boron etc.) thereof and a silicon compound not denatured is ejected from the droplet ejecting head to fill in the openings a3, a4. Hereinafter, the solution containing such silicon compound is referred to as "a silicon solution".

Next, the silicon solutions filled in the respective openings a3, a4 are dried and then baked at a temperature of 300° C. to 400° C. These series of processes are carried out in an atmosphere of inert gas such as nitrogen. By doing so, the source/drain regions 22 made of the amorphous silicon film into which dopants (donor or acceptor) are doped heavily are formed in the openings a3, a4 of which the peripheries are surrounded by the bank made of the polyimide film 20.

Here, it is preferable that silane of a higher order photopolymerized by irradiating ultraviolet rays into something having one or more ring-shaped structures such as cyclopentasilane ($Si_5H_{10}$) etc. is used as the aforementioned silicon compound. In this case, it is more preferable that the silane compound is formed by irradiating the UV rays after the mixture of a phosphor compound and a boron compound and receiving it during the polymerization. Further, the solvent for preparing the silicon solution is not specifically limited if it dissolves the silicon compound and it does not react with the compound, but in common, it is preferable that vapor pressure of room temperature is 0.001 to 200 mmHg. A specific example of the solvent includes a hydrocarbon group solvent such as benzene or toluene.

Furthermore, it is more preferable that before ejecting the silicon solution from the droplet ejection head, the insides of the openings a3, a4 are made to be lyophilic and the circumferences thereof are made to be lyophobic. The lyophilic and lyophobic processing can be implemented by processing the whole glass substrate 10 with the oxygen plasma in the atmospheric pressure plasma to be lyophilic and subsequently processing it with $CF_4$ plasma only for the polyimide film 20 portion to be lyophobic.

Process for Forming the Data Line and Connecting Portion

Figure 8:
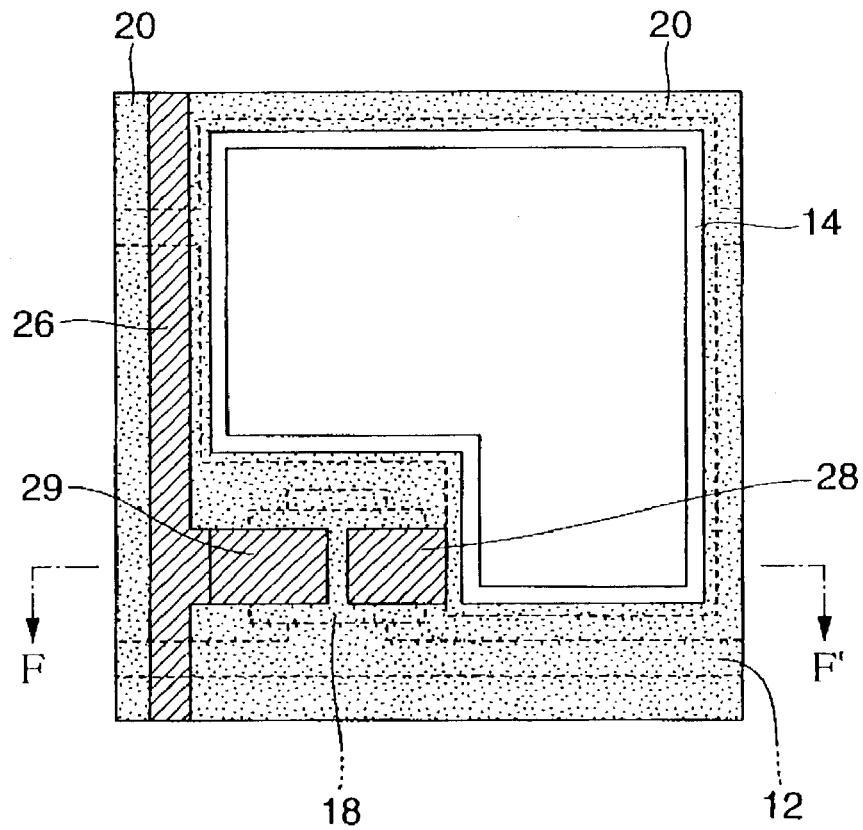
FIGS. 8a and 8b are explanatory views illustrating a manufacturing method according to an embodiment of the present invention.
Figure 8:
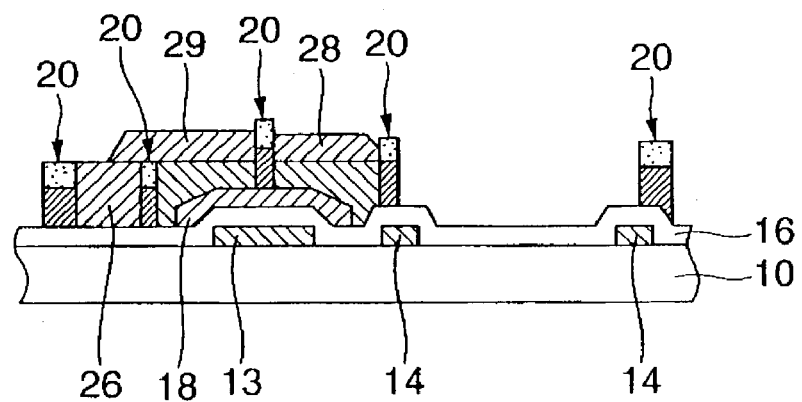

FIG. 8 illustrates the process for forming the data line and connecting portion. FIG. 8(*a*) is a plan view of the glass substrate 10 seen from the upper side and FIG. 8(*b*) is a cross-sectional view taken along a line F–F' shown in FIG. 8(*a*).

As shown in FIG. 8, the data line 26 is formed within the opening a2 (see FIG. 6) provided in the polyimide wall 20. In this embodiment, the data line 26 is also formed by using the droplet ejection method. Specifically, a solution containing conductive fine particles is ejected from the droplet ejection head by means of the droplet ejection method to fill in the opening a2, and then the dry processing and the thermal treatment (for example, for 30 minutes at 300° C.) are carried out. As a result, the data line 26 is formed within the opening a2 of which the periphery is surrounded with a bank made of the polyimide film 20. Here, as the conductive fine particles, metal fine particles containing any element selected among gold, silver, copper, palladium and nickel or fine particles of conductive polymer or super-semiconductor can be considered. In this embodiment, the solution formed by dispersing metal fine particles containing silver in an organic solvent is employed. In order to disperse the fine particles, the surfaces of the fine particles may be coated with organic materials. Furthermore, in applying to the substrate, it is preferable that diameters of the fine particles are 0.1 μm or less for facilitating the dispersion into the solvent and applying the droplet ejection method.

Furthermore, the connecting portion 28 for accomplishing the electrical connection between one side of the source/drain regions 22 and the pixel electrode formed in a later process and the connecting portion 29 for accomplishing the electrical connection between the source/drain regions 22 and the data line 26 is formed by using the aforementioned solution containing the metal micro-fine particles in addition to the formation of the data line 26. As shown in FIG. 8, the connecting portion 29 is formed to extend over the bank made of the polyimide film 20 between the source/drain regions 22 and the data line 26.

Process for Forming Color Filter and Pixel Electrode

Figure 9:
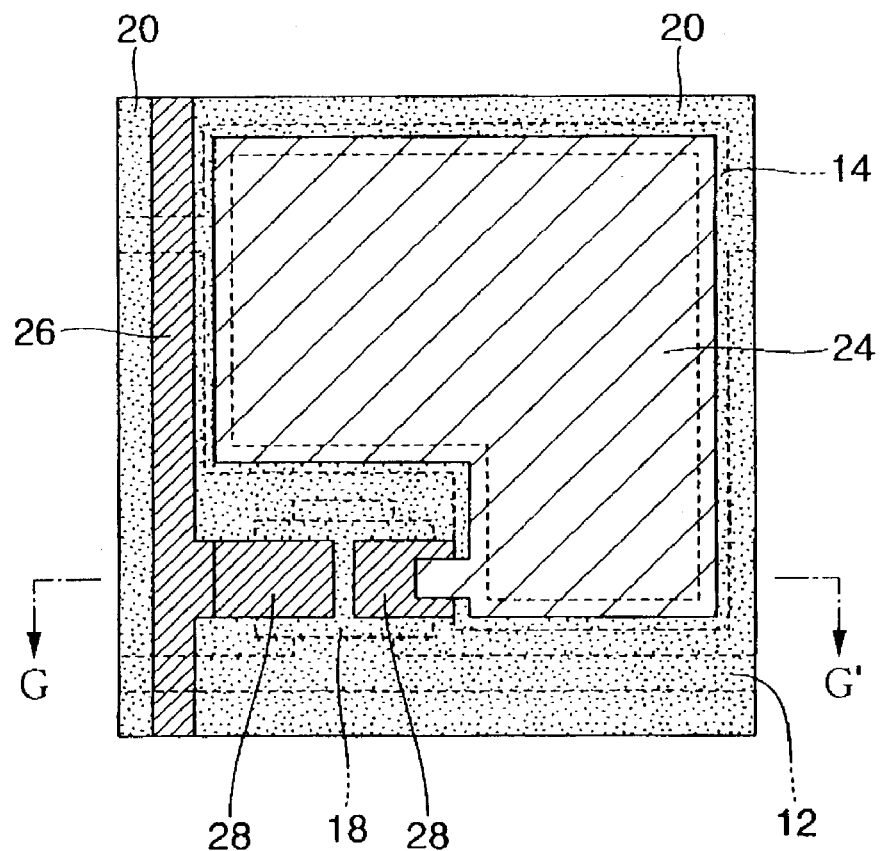
FIGS. 9a and 9b are explanatory views illustrating a manufacturing method according to an embodiment of the present invention.
Figure 9:
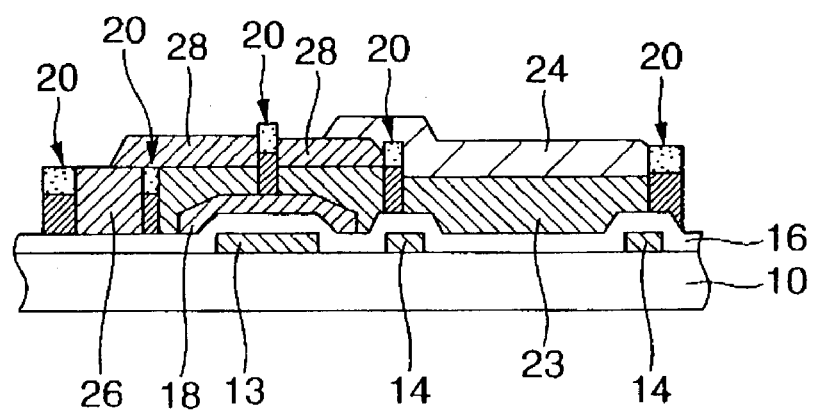

FIG. 9 illustrates the process for forming the color filter and the pixel electrode. FIG. 9(*a*) is a plan view of the glass substrate 10 seen from the upper side and. FIG. 9(*b*) is a cross-sectional view taken along a line G–G' shown in FIG. 9(*a*).

As shown in FIG. 9, the color filter 23 is formed within the opening a1 (see FIG. 6) provided in the polyimide film 20. In this embodiment, the color filter 23 is also formed by using the droplet ejection method. Specifically, the resin composition for color filter is ejected from the droplet ejection head to fill in the opening a1 and then the dry processing and the thermal treatment are carried out. As a result, the color filter 23 is formed within the opening a1 of which the periphery is surrounded with the bank made of the polyimide film 20.

Next, the pixel electrode 24 is formed on the color filter 23. As shown in FIG. 9, the pixel electrode 24 made of ITO (Indium Tin Oxide) film is formed on the color filter 23 previously formed within the opening a1 (see FIG. 6) provided in the polyimide film 20. In this embodiment, the pixel electrode 24 is also formed by using the droplet ejection method. Specifically, the ITO solution is ejected from the droplet ejection head to fill in the opening a1 and then the dry processing and the thermal treatment are carried out. As a result, the pixel electrode is formed within the opening a1 of which the periphery is surrounded with the bank made of the polyimide film 20. For example, by filling in the opening a1 with ITO solution, drying it in an air atmosphere at 160° C. for 5 minutes and then performing the thermal treatment in the air atmosphere at 250° C. for 60 minutes, the pixel electrode 24 having a thickness of about 1500 Å can be formed.

Furthermore, the pixel electrode 24 is partially connected to the connecting portion 28 and the electrical connection therebetween is formed. As shown in FIG. 9, a portion of the pixel electrode 24 is formed to extend over the bank made of the polyimide film 20 between the source/drain regions 22 and the pixel electrode 24.

Process for Forming Antireflection Film

Next, as shown in FIG. 3, an antireflection film 30 is formed by applying an insulating black-colored ink to each of the upper surfaces of the connecting portions 28, 29 formed on the data line 26 and the source/drain regions 22 of the thin film transistor T and drying it. As described above, the antireflection film 30 has not only the function of preventing the light reflection from the surface of the data line 26 and the connecting portions 28, 29 made of metal films but also the function as a protective film for protecting the data line 26 and the connecting portions 28, 29.

By the manufacturing process described above, the thin film transistor T of this embodiment shown in FIG. 3 and the pixel portion 100 including it are completed. Furthermore, a protective film made of silicon oxide film etc. may be formed on the upper surface of the pixel portion 100 as needed.

Like above, in the manufacturing method of this embodiment, by forming the polyimide film 20 which surrounds regions for some elements of the liquid crystal display device with the wall and applying the liquid material to the regions surrounded by the wall made of the polyimide film 20 to form the films, each element is formed. Accordingly, the number of execution steps of the conventional process for film formation combining the vapor phase deposition method such as the CVD method or the sputtering method and the photolithography method can be reduced to simplify the manufacturing processes and thus the manufacturing time can be reduced. Furthermore, since the wall made of the polyimide film 20 is provided, it is possible to minimize the range to which the liquid material is applied and as a result, the utilization efficiency of raw material is good. Furthermore, since the number of etching processes are reduced, it is possible to reduce the amount of waste and thus to reduce the processing cost. Therefore, it is possible to reduce the manufacturing cost of device.

Furthermore, since the polyimide film 20 has a light-shielding property, incident light to the portions surrounded with the polyimide film 20 can be shielded. By doing so, it is possible to avoid any erroneous operation or any changes of output characteristics due to the light irradiation to the channel region 18 of the thin film transistor T formed below the polyimide film 20. Therefore, since a separate process for forming a light shielding film for avoiding the light irradiation to the channel region 18 is not necessary, it is possible to simplify the manufacturing process and thus to reduce the processing cost.

Next, another embodiment for the formation process of the color filter and the pixel electrode will be described. In the aforementioned embodiment, the color filter was first formed and the pixel electrode was formed thereon to overlap the color filter. However, the pixel electrode may be first formed and then the color filter may be formed to overlap the pixel electrode. Now, the process for forming the color filter and the pixel electrode according to this embodiment will be described.

Figure 10:
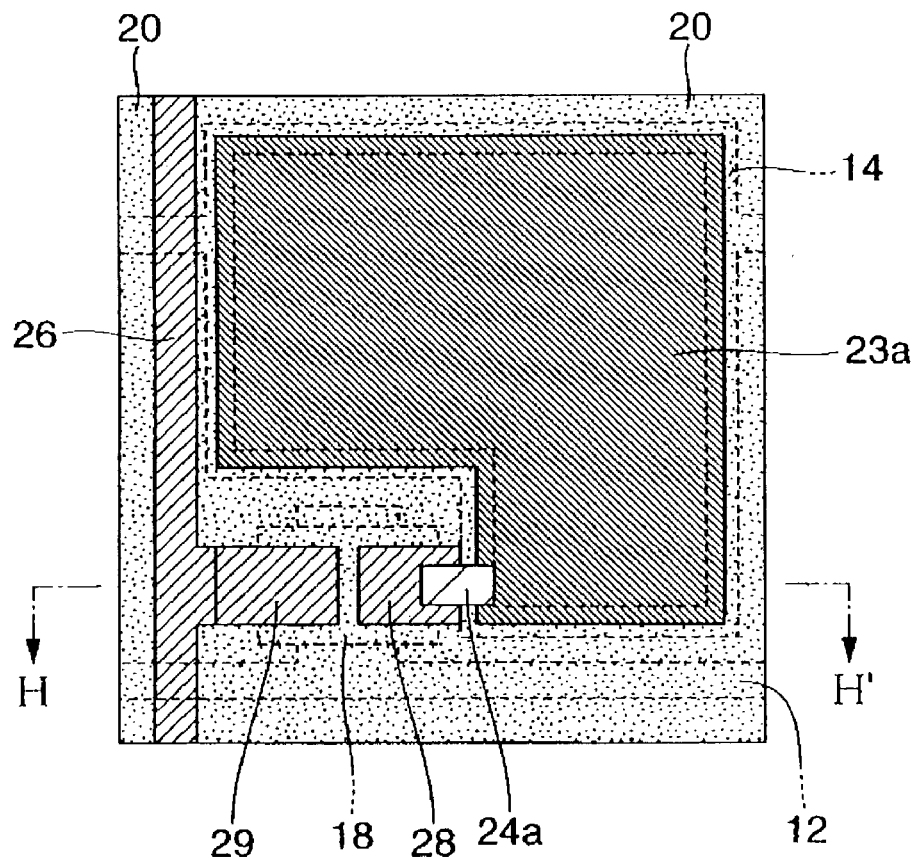
FIGS. 10a and 10b are explanatory views illustrating the forming process that the pixel electrode is first formed and then the color filter is formed thereon.
Figure 10:
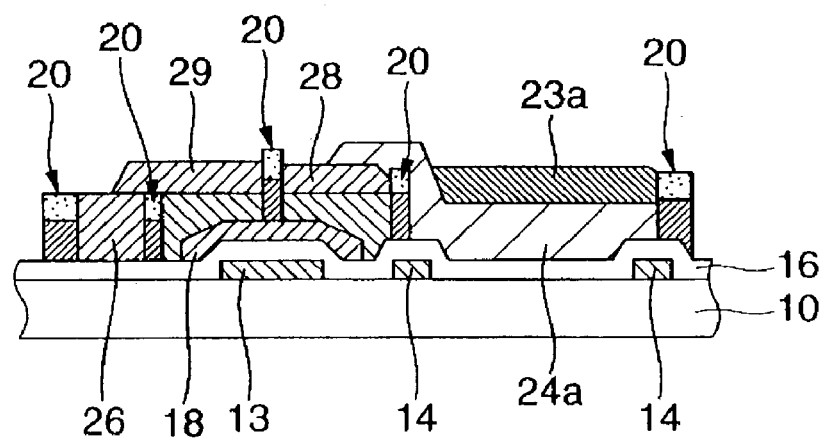

FIG. 10 illustrates the forming process when the pixel electrode is first formed and then the color filter is formed thereon. FIG. 10(a) is a plan view of the glass substrate 10 seen from the upper side and FIG. 10(b) is a cross-sectional view taken along a line H–H' shown in FIG. 10(a).

As shown in FIG. 10, the pixel electrode 24a made of ITO (Indium Tin Oxide) film is formed within the opening a1 (see FIG. 6) provided in the polyimide film 20 by using the droplet ejection method. Specifically, the ITO solution is ejected from the droplet ejection head to fill in the opening a1 and then the dry processing and the thermal treatment are carried out. As a result, the pixel electrode 24a is formed within the opening a1 of which the periphery is surrounded with the bank made of the polyimide film 20. Furthermore, the pixel electrode 24a is partially connected to the connecting portion 28a and thus the electrical connection therebetween is formed. Specifically, as shown in FIG. 10, a portion of the pixel electrode 24a is formed to extend over the bank made of the polyimide film 20 between the source/drain regions 22 and the pixel electrode 24a.

Next, as shown in FIG. 10, the color filter 23a is formed on the pixel electrode 24a within the opening a1 (see FIG. 6) provided in the polyimide film 20 by using the droplet ejection method. Specifically, the resin composition for the color filter is ejected from the droplet ejection head to fill in the opening a1 and then the dry processing and the thermal treatment are carried out. As a result, the color filter 23a is formed within the opening a1 of which the periphery is surrounded with the bank made of the polyimide film 20. Next, an antireflection film 30 is formed similar to the aforementioned embodiment to form the thin film transistor T.

Furthermore, although in the aforementioned embodiment, the pixel region is formed by forming the color filter and the pixel electrode to overlap each other, but the pixel region may be formed as a single bodied functional film having the respective functions of the color filter (CF) and the pixel electrode. Furthermore, hereinafter, the functional film having the respective functions of the color filter and the pixel electrode is referred to as a "CF/pixel electrode". Now, the process for forming the CF/pixel electrode in this embodiment will be described.

Figure 11:
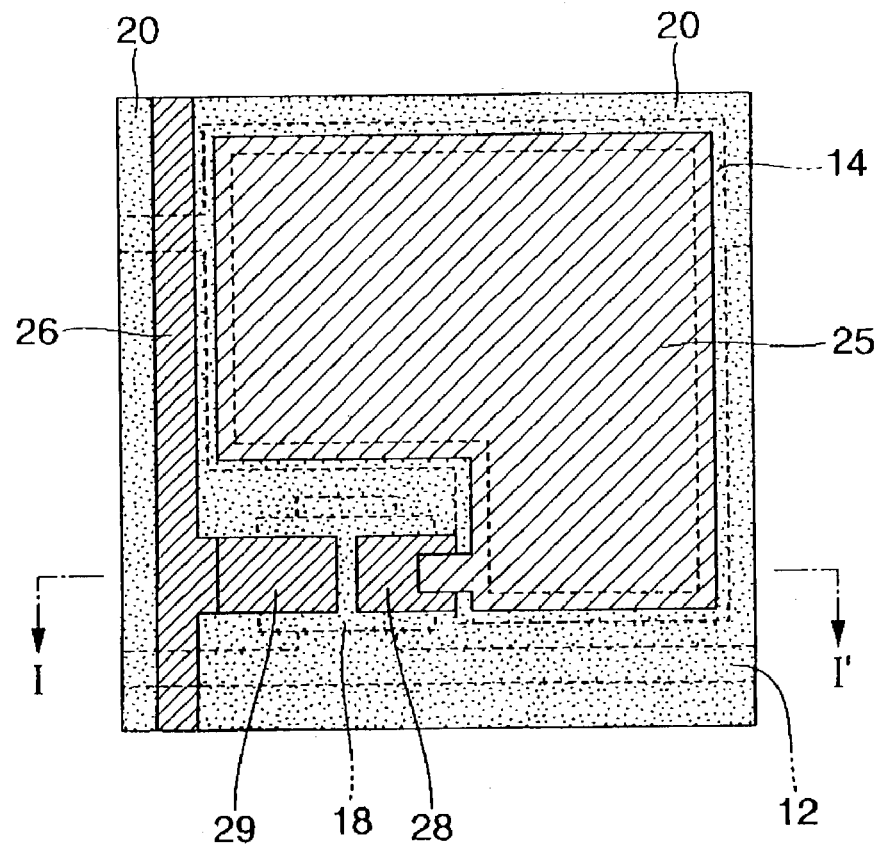
FIGS. 11a and 11b are explanatory views illustrating the forming process that the pixel electrode (CF/pixel electrode) having the function of color filter is formed.
Figure 11:
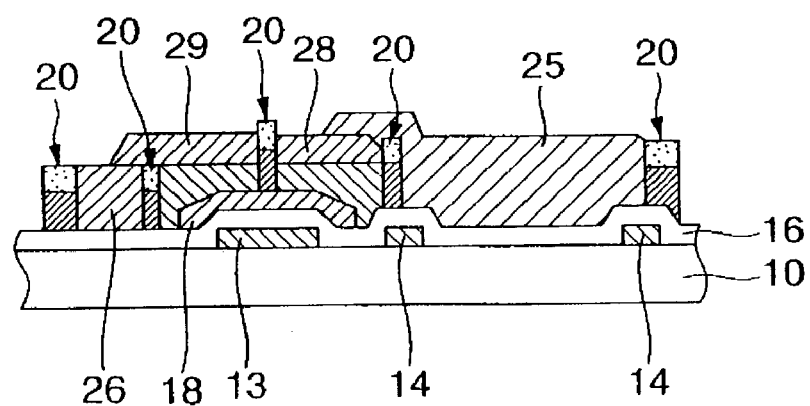

FIG. 11 illustrate the forming process when the pixel electrode (CF/pixel electrode) having the function of color filter is formed. FIG. 11(a) is a plan view of the glass substrate 10 seen from the upper side and FIG. 11(*b*) is a cross-sectional view taken along a line K–K' shown in FIG. 11(*a*).

As shown in FIG. 11, the CF/pixel electrode 25 is formed within the opening a1 provided in the polyimide film 20 by using the droplet ejection method. Specifically, a solution prepared by adding various dyes or pigments or coloring material such as conductive color resist to the applying ITO solution is ejected from the droplet ejection head to fill in the opening a1 and then the dry processing and the thermal treatment are carried out. As a result, the CF/pixel electrode 25 is formed within the opening a1 of which the periphery is surrounded with the bank made of the polyimide film 20. Furthermore, the CF/pixel electrode 25 is partially connected to the connecting portion 28 and thus the electrical connection therebetween is formed. Specifically, as shown in FIG. 11, a portion of the CF/pixel electrode 25 is formed to extend over the bank made of the polyimide film 20 between the source/drain regions 22 and the CF/pixel electrode 25.

Furthermore, although in the aforementioned embodiments, the color filter and the pixel electrode have been formed after the data line has been formed, these formations may be carried out inversely.

Furthermore, although in the aforementioned embodiments, the amorphous silicon film wherein, in the channel region 18 of the thin film transistor T has been formed by using the vapor phase deposition method such as the PECVD method, it also may be formed by using the droplet ejection method.

Figure 12:
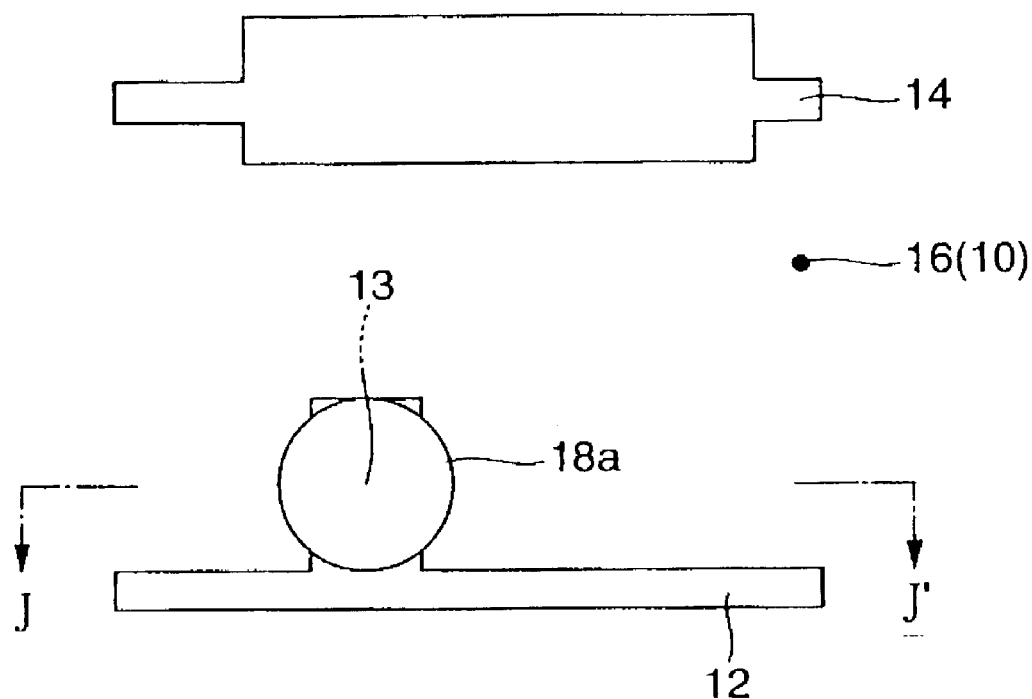
FIGS. 12a and 12b are views illustrating the process for forming the amorphous silicon film by using the droplet ejection method.
Figure 12:
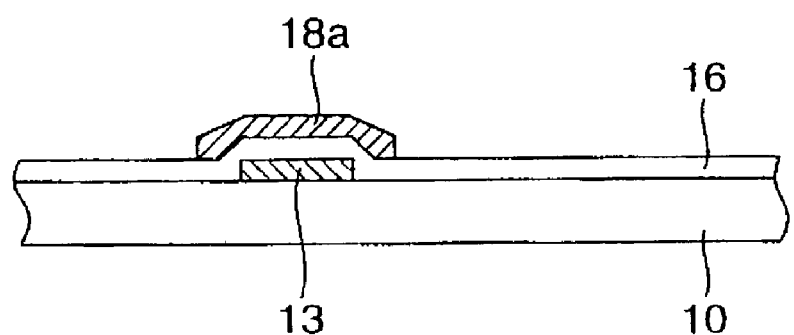

FIG. 12 illustrates the process for forming the amorphous silicon film using the droplet ejection method. FIG. 12(*a*) is a plan view of the glass substrate 10 seen from the upper side and FIG. 12(*b*) is a cross-sectional view taken along a line J–J' shown in FIG. 12(*a*).

First, similarly to the aforementioned embodiments, the gate insulating film 16 is formed on the whole upper surface of the glass substrate 10 to cover the gate line 12, the gate electrode 13 and the capacitor line 14, respectively (see FIG. 5). Next, the glass substrate 10 on which the gate insulating film 16 has been formed is introduced into nitrogen atmosphere.

Next, by using the droplet ejection head, the silicon solution (solution containing silicon compound) is ejected to a range in which the channel region should be formed. It is preferable that the silicon solution contains the same silicon compound as used in formation of the aforementioned source/drain regions but does not contains the dopant source made of the Group V element of phosphorus etc. or the Group III element of boron etc.

Thereafter, by drying the ejected silicon solution and baking it at a temperature of 300° C. to 400° C., the channel region 18*a* having a island shape (isolated) made of the amorphous silicon is formed at a predetermined position on the gate electrode 13 as shown in FIG. 12. Since the channel region 18*a* has a relatively low accuracy in measurement, even if the silicon solution ejected in the droplet ejection method is rather diffused, it does not matter. Furthermore, when the diffusion of solution exceeds the allowable range, it is possible to suppress the diffusion of the silicon solution, by making the whole surface of the substrate be lyophobic, or by making it be lyophilic only the range in which the channel region 18*a* should be formed and making the other range be lyophobic.

Figure 13:
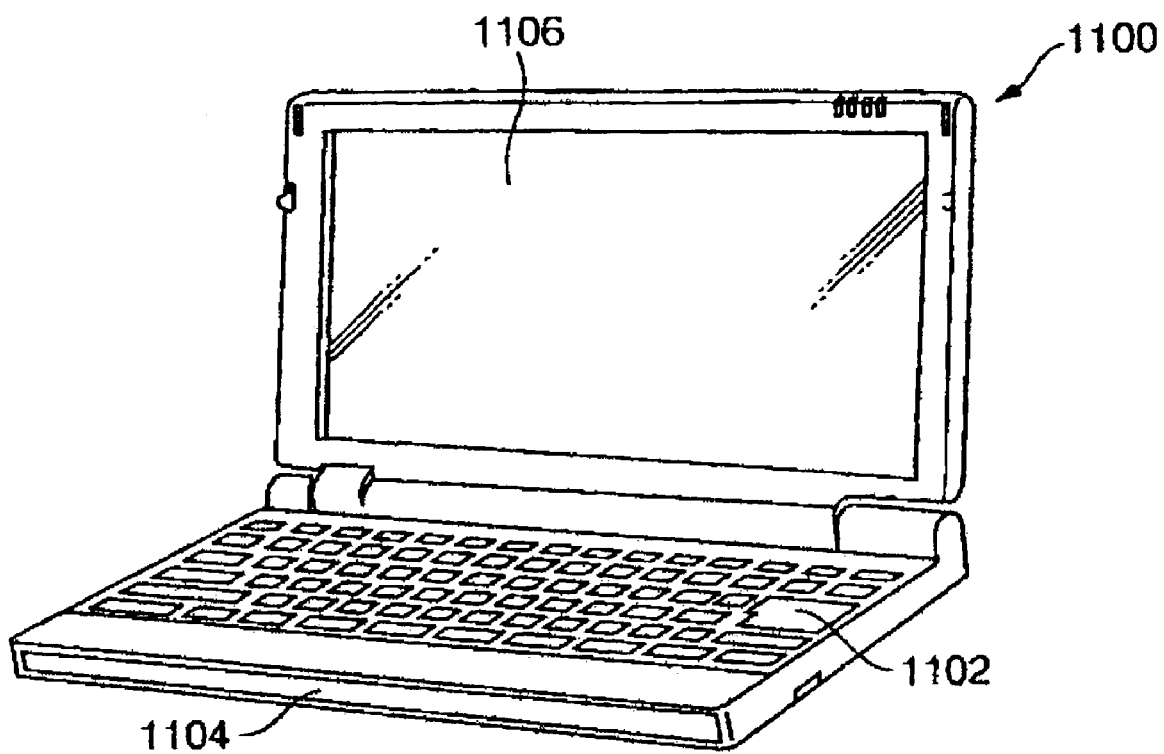
FIG. 13 is a perspective view illustrating an example that the liquid crystal display device applies to a mobile personal computer (information processing apparatus).

Next, an electronic apparatus including the liquid crystal display device according to the aforementioned embodiments will be described. FIG. 13 is a perspective view illustrating an example that the liquid crystal display device according to this embodiment applies to a mobile personal computer (information processing apparatus). In the FIG. 13, the personal computer 1100 comprises a main body 1104 including a keyboard 1102 and a liquid crystal display device 1106 according to this embodiment. The manufacturing method according to this embodiment is specifically suitable for manufacturing the liquid crystal display device of which the screen size is large as shown in FIG. 13.

Furthermore, the electronic apparatus comprising the liquid crystal display device of this embodiment may include, in addition to the personal computer shown in FIG. 13, various electronic apparatuses such as a digital still camera, an electronic book, an electronic paper, a liquid crystal television, a view finder type or monitor direct vision-type videotape recorder, a car navigation apparatus, a pager, a notebook, a calculator, a word processor, a work station, a television phone, a POS terminal, an apparatus including a touch panel and the like.

Effects of the Invention

As described above, according to the present invention, the number of execution steps of the conventional process for film formation combining the vapor phase deposition method such as the CVD method or the sputtering method and the photolithography method can be reduced to simplify the manufacturing processes and thus the manufacturing time can be reduced. Furthermore, since the partition walls are provided, it is possible to minimize the range to which the liquid material is applied and as a result, the utilization efficiency of raw material is good. Furthermore, since the number of etching processes are reduced, it is possible to reduce the amount of waste and thus to reduce the processing cost. Therefore, it is possible to reduce the manufacturing cost of the resulting device. Furthermore, by means of application of the manufacturing method of the present invention, it is possible to reduce the cost of the device. Furthermore, since the partition wall has a light-shielding property, the partition wall has an additional function as a light shielding film so that it is possible to avoid any erroneous operation due to light irradiation to thin film devices such as a thin film transistor, etc. formed below the partition wall or any changes of output characteristics. Therefore, since a separate process for forming a light shielding film is not necessary, it is possible to simplify the manufacturing process and thus to reduce the processing cost.

The entire disclosure of Japanese Patent Application No. 2002-119969 filed Apr. 22, 2002 is incorporated by reference.

What is claimed is:

1. An array substrate, comprising:
    a gate electrode;
    a semiconductor film;
    a gate insulating layer formed between the gate electrode and the semiconductor film;
    a first conductive film formed over the semiconductor film;
    a second conductive film formed over the semiconductor film;
    a partition wall formed over the gate insulating layer, wherein the partition wall forms at least a first loop, a second loop and a third loop, and at least a portion of the partition wall contacts the semiconductor film; and
    a pixel electrode having a first portion and a second portion, the first portion being surrounded by the first loop of the partition wall, the first portion not overlapping vertically with the partition wall, the first portion contacting the partition wall, the second portion not being surrounded by the first loop of the partition wall, the second portion overlapping vertically with the partition wall, contacting the partition wall, and contacting the first conductive film, wherein at least a portion of the first conductive film forms at least a portion of a drain electrode, at least a portion of the second conductive film forms at least a portion of a source electrode; and the portion of the source electrode and the portion of the drain electrode are respectively surrounded by the second loop and the third loop.

2. The array substrate according to claim 1, further comprising:

a color filter layer surrounded by the first loop of the partition wall, the color filter layer formed on and contacting the first portion of the pixel electrode, the second portion of the pixel electrode does not directly contact the color filter layer.

3. The array substrate according to claim 1, the first conductive film having a first layer and a second layer, the first layer including a doped silicon, the first layer contacting the semiconductor film, the second layer including a conductive particle.

4. The array substrate according to claim 1, the partition wall having a first part and a second part, the first part including a light shielding material.

5. The array substrate according to claim 4, the second part including an ultraviolet cured material.

6. The array substrate according to claim 1, further comprising:

a wiring, a first part of the wiring being separated from the second conductive film by the partition wall, a second part of the wiring being formed on at least a part of the partition wall and contacting the second conductive film, the first part of the wiring and the second part of the wiring including the same conductive material.

7. The array substrate according to claim 6, the second conductive film including a doped silicon, and the second part of the wiring including a conductive particle.

8. The array substrate according to claim 1, wherein at least a part of each of the first and the second conductive films contact the gate insulating layer.

9. A liquid crystal display devise device having the array substrate according to claim 1.

10. An electronic apparatus having the liquid crystal display device according to claim 9.

11. The array substrate according to claim 1, the partition wall not overlapping vertically with the first conductive film.

12. An array substrate, comprising:

a gate electrode;

a semiconductor film;

a gate insulating layer formed between the gate electrode and the semiconductor film;

a first conductive film formed over the semiconductor film;

a second conductive film formed over the semiconductor film;

a partition wall formed over the gate insulating layer, wherein the partition wall forms at least a first loop, a second loop and a third loop, and at least a portion of the partition wall contacts the semiconductor film;

a color filter surrounded by the first loop of the partition wall, the color filter being separated from the first conductive film by the partition wall; and a pixel electrode having a first portion and a second portion, the first portion being surrounded by the first loop of the partition wall, the first portion not overlapping vertically with the partition wall, the first portion contacting the partition wall, and overlapping with the color filter, the second portion not being surrounded by the first loop of the partition wall, the second portion overlapping vertically with the partition wall, contacting the partition wall, contacting the first conductive film, and not overlapping with the color filter, wherein at least a portion of the first conductive film forms at least a portion of a drain electrode, at least a portion of the second conductive film forms at least a portion of a source electrode; and the portion of the source electrode and the portion of the drain electrode are respectively surrounded by the second loop and the third loop.

* * * * *